United States Patent
Bansal et al.

(10) Patent No.: US 9,036,436 B2
(45) Date of Patent: May 19, 2015

(54) SUPPORTING CALIBRATION FOR SUB-RATE OPERATION IN CLOCKED MEMORY SYSTEMS

(75) Inventors: Akash Bansal, Santa Clara, CA (US); Yohan U. Frans, Palo Alto, CA (US); Kishore V. Kasamsetty, Cupertino, CA (US); Todd Bystrom, Los Altos, CA (US); Simon Li, Cupertino, CA (US); Arun Vaidyanath, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/982,474

(22) PCT Filed: May 3, 2012

(86) PCT No.: PCT/US2012/036370
§ 371 (c)(1),
(2), (4) Date: Jul. 29, 2013

(87) PCT Pub. No.: WO2012/154507
PCT Pub. Date: Nov. 15, 2012

(65) Prior Publication Data
US 2013/0301368 A1    Nov. 14, 2013

Related U.S. Application Data

(60) Provisional application No. 61/483,558, filed on May 6, 2011.

(51) Int. Cl.
*G11C 7/22* (2006.01)
*G11C 29/02* (2006.01)
*G06F 1/10* (2006.01)

(52) U.S. Cl.
CPC ....... *G11C 7/22* (2013.01); *G11C 7/222* (2013.01); *G11C 29/023* (2013.01); *G11C 29/028* (2013.01); *G11C 2207/2254* (2013.01); *G06F 1/10* (2013.01)

(58) Field of Classification Search
None
See application file for complete search history.

(56) References Cited

U.S. PATENT DOCUMENTS

| | | | |
|---|---|---|---|
| 6,735,709 B1 * | 5/2004 | Lee et al. | 713/401 |
| 2002/0133666 A1 | 9/2002 | Janzen et al. | |
| 2005/0163202 A1 | 7/2005 | Hampel et al. | |
| 2010/0202227 A1 | 8/2010 | Nguyen et al. | |

OTHER PUBLICATIONS

International Search Report and Written Opinion dated Jul. 26, 2012 in International Application No. PCT/US2012/036370. 12 pages.
International Preliminary Report on Patentability dated Nov. 21, 2013 in International Application No. PCT/US2012/036370. 9 pages.

* cited by examiner

Primary Examiner — James G Norman

(57) ABSTRACT

The disclosed embodiments related to a clocked memory system which performs a calibration operation at a full-rate frequency to determine a full-rate calibration state that specifies a delay between a clock signal and a corresponding data signal in the clocked memory system. Next, the clocked memory system uses the full-rate calibration state to calculate a sub-rate calibration state, which is associated with a sub-rate frequency (e.g., 1/2, 1/4 or 1/8 of the full-rate frequency). The system then uses this sub-rate calibration state when the clocked memory system is operating at the sub-rate frequency. This calculation of the sub-rate state calibration states eliminates the need to perform an additional time-consuming calibration operation for each sub-rate.

20 Claims, 6 Drawing Sheets

SUPPORTING CALIBRATION FOR SUB-RATE OPERATION IN CLOCKED MEMORY SYSTEMS

This disclosure is 35 USC §371 entry of Patent Cooperation Treaty Application No. PCT/US2012/036370 (filed on May 3, 2012), which in turn claims priority to U.S. Provisional Patent Application No. 61/483558, filed on May 6, 2011. Each of these prior applications was filed for "Supporting Calibration For Sub-Rate Operation In Clocked Memory Systems" on behalf of inventors Akash Bansal, Yohan U. Frans, Kishore V. Kasamsetty, Todd Bystrom, Simon Li and Arun Vaidyanath. Each of these prior applications is hereby incorporated by reference.

BACKGROUND

1. Field

The disclosed embodiments generally relate to clocked memory systems. More specifically, the disclosed embodiments relate to a technique for supporting calibration for full-rate and sub-rate operation in low-power clocked memory systems.

2. Related Art

Mobile computing systems typically operate at reduced clock frequencies when computational workloads are low. These reduced clock frequencies make it possible to decrease power consumption, which can significantly extend battery life. As the clock frequency of a mobile computing system decreases, the operating frequency of an associated clocked memory system needs to decrease proportionately. In existing calibrated memory systems (such as systems using extreme data rate (XDR) or double-data rate (DDR) memory interfaces) this typically involves performing a recalibration operation to ensure that the clocked memory system continues to function optimally at the decreased operating frequency. This is particularly important because as clock frequencies are reduced, the calibration setting will change because of frequency dependent delay and jitter in the system, which creates the need for additional timing margin so that the system is correctly calibrated for data sampling during lower frequency operation. Hence, in high-speed calibrated memory systems, the bit sampling phase and word alignment settings need to be changed when the frequency changes. Note that systems which use fixed delay lines have suboptimal settings (with equal or lower timing margins) at lower operating frequencies. Unfortunately, this recalibration operation is time-consuming which can adversely affect memory system performance, and can make it less attractive to reduce clock frequencies for short periods of time.

Hence, what is needed is a technique that facilitates reducing the operating frequency of a memory system without the need to perform a time-consuming recalibration operation.

DETAILED DESCRIPTION

The disclosed embodiments relate the design of a clocked memory system that supports full-rate operation at a full-rate clock frequency as well as sub-rate operation at one or more sub-rate frequencies. While the clocked memory system is operating, the clocked memory system performs a calibration operation at the full-rate clock frequency to determine a full-rate calibration state that specifies a delay between a clock signal and a corresponding data signal in the clocked memory system. Next, the clocked memory system uses the full-rate calibration state to calculate a sub-rate calibration state, which is associated with a sub-rate frequency (e.g., 1/2, 1/4 or 1/8 of the full-rate frequency). The system then uses this sub-rate calibration state while the clocked memory system is operating at the sub-rate frequency. Note that the calculation of the sub-rate state calibration state eliminates the need to perform an additional time-consuming calibration operation for each sub-rate.

Clocked Memory System

Figure 1:
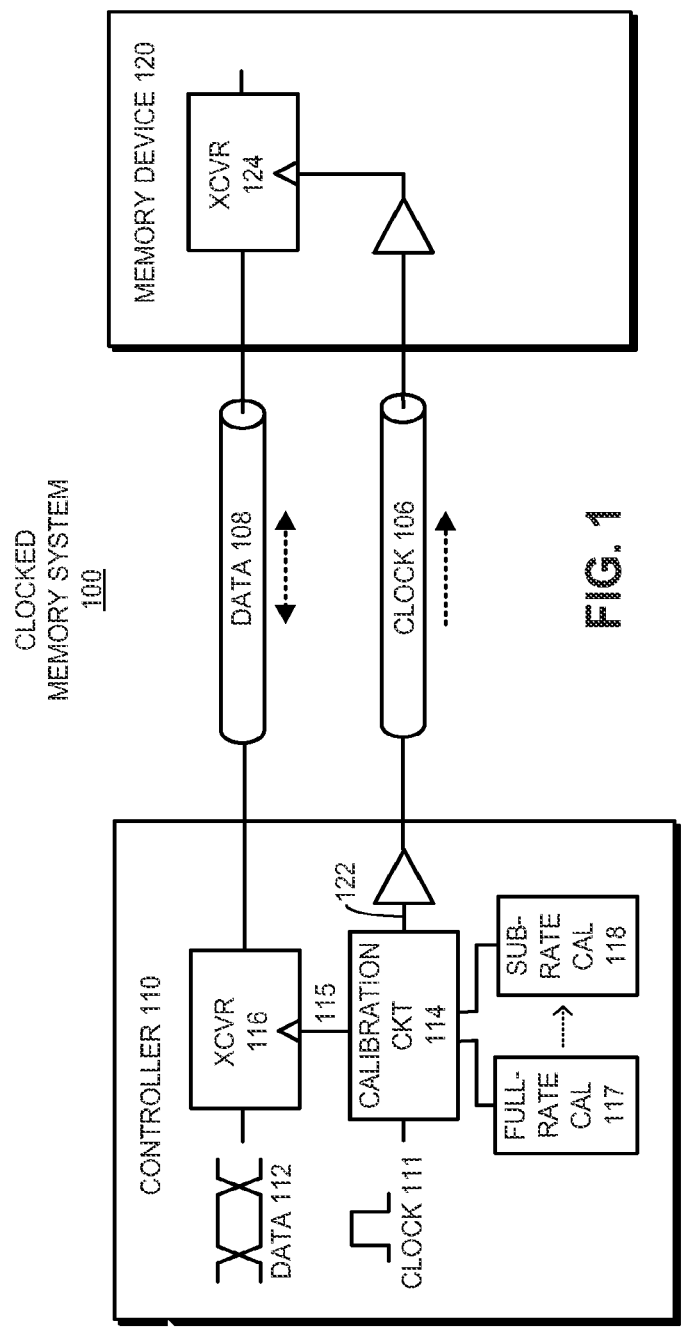
FIG. 1 illustrates a clocked memory system in accordance with the disclosed embodiments.

Referring to FIG. 1, a clocked memory system 100 includes a memory controller 110 that communicates with at least one memory device 102 though a bi-directional data path 108 and a clock path 106. During operation of clocked memory system 100, data signals 112 are transferred between a transceiver (XCVR) 116 on controller 110 and a corresponding transceiver (XCVR) 124 on a memory device 120 through data path 108. More specifically, during write operations, data is transmitted from transceiver 116 in controller 110 to transceiver 124 in memory device 120. Similarly, during read operations, data is transferred in the other direction from transceiver 124 in memory device 120 to transceiver 116 in controller 110.

These data transfers are synchronized by a clock signal 111, which feeds into a calibration circuit 114 within controller 110. Calibration circuit 114 generates a controller clock signal 115 that feeds into XCVR 116 and a memory clock signal 122, which feeds through clock path 106 to XCVR 124 within memory device 120.

Calibration circuit 114 makes use of a full-rate calibration state 117 to determine the appropriate delay between controller clock signal 111 and memory clock signal 122, and also the appropriate delay between controller clock signal 111 and controller clock signal 115, for both read and write operations during full-rate operation of clocked memory system 100. (Note that full-rate calibration state 117 and a sub-rate calibration state 118 can be stored in registers within controller 110.) Similarly, during sub-rate operation (e.g., 1/2, 1/4 or 1/8 rate), calibration circuit 114 makes use of one or more sub-rate calibration states 118 to determine associated read and write delays. Note that clocked memory system 110 calculates the sub-rate calibration states 118 from full-rate calibration state 117 (as is described below) without having to perform additional sub-rate calibrations at other clock rates.

Figure 2:
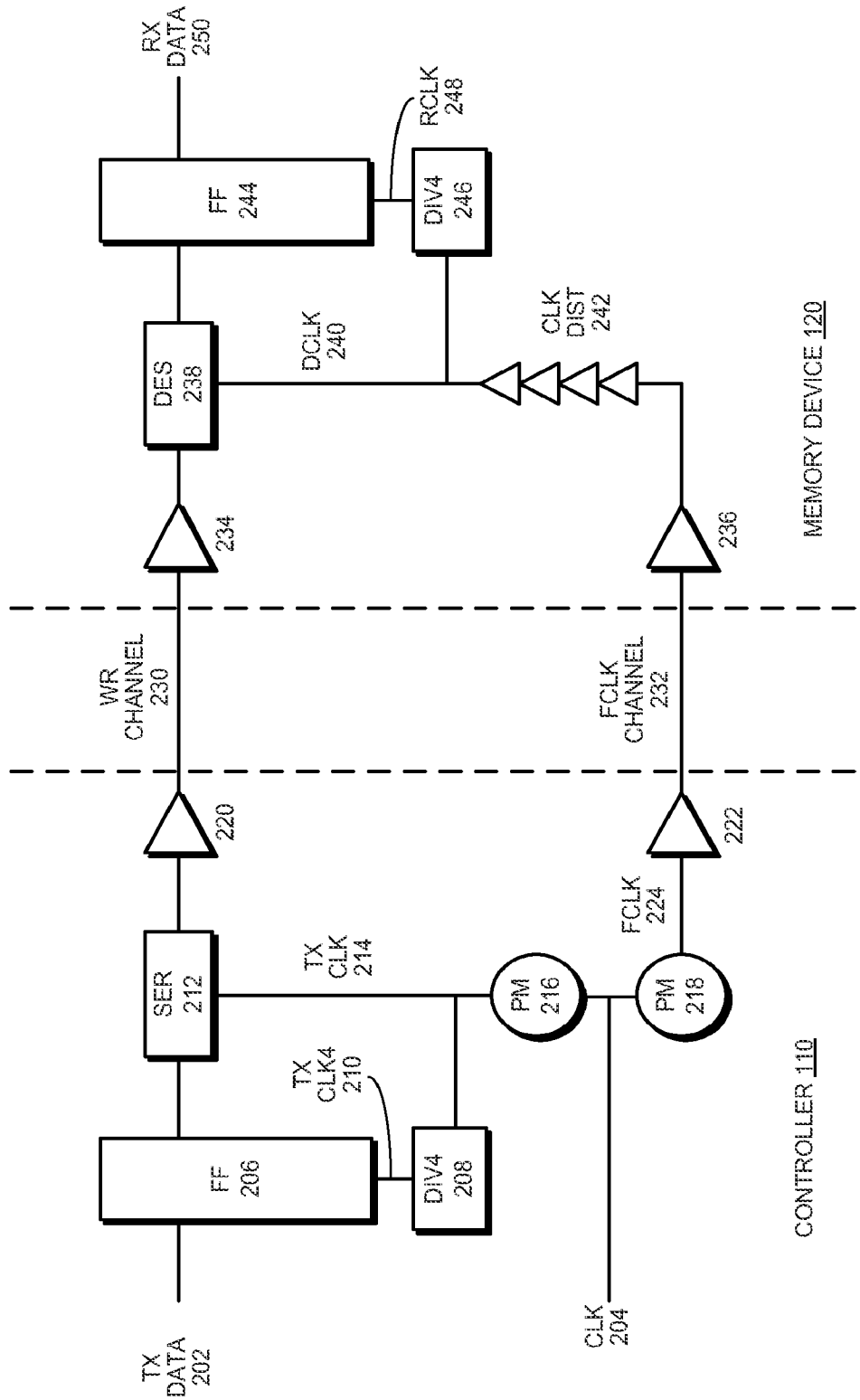
FIG. 2 illustrates a transmitter and receiver circuit in accordance with the disclosed embodiments.

The circuitry presented in FIG. 1 is illustrated in more detail in FIG. 2, which presents circuitry involved in calibrating a write operation. (Note that similar circuitry is involved in performing a read operation, except that the data is transferred in the reverse direction through the data channel.) During a write operation, which starts at controller 110, an eight-bit data word from transmit data 202 is clocked into a flip-flop (FF) 206 using a divided clock signal TX CLK4 210. Next, this eight-bit data word feeds into a serializer (SER) 212, which operates under control of a clock signal TX CLK 214 and converts the eight-bit data word into a serial bit stream, which feeds through driver 220 onto a write channel 230. (Note that write channel 230 can be implemented as part of the bi-directional data channel 108 that is illustrated in FIG. 1.) The serial data stream from write channel 230 feeds into a receiver 234 within memory device 120 and then into a deserializer (DES) 238. Deserializer 238 uses a clock signal DCLK 240 to de-serialize the data stream to produce an eight-bit data word, which is clocked into a flip-flop 244 by a clock signal RCLK 248. Flip-flop 244 then outputs the eight-bit data word as receive data (RX DATA) 250, which can be written to a location within memory device 120.

During this write operation, much of the circuitry illustrated in FIG. 2 is used to synchronize and calibrate various clock signals. More specifically, within controller 110, a reference clock signal 204 feeds into two phase mixers (PMs) 216 and 218, which are each controlled by a calibration input (not shown). Phase mixer 216 generates clock signal TX CLK 214, which feeds into serializer 212. TX CLK signal 214 also feeds through a clock divider DIV4 208 to produce divided clock signal 210, which is used to latch data words into flip-flop 206. The other phase mixer 218 generates a clock signal FCLK 224, which feeds into a driver 222 and is thus driven across a FCLK channel 323 and into a receiver 236 within memory device 120. Receiver 236 drives the received clock signal through a clock distribution network (CLK DST) 242 into deserializer 238, which uses the received clock signal to de-serialize the received eight-bit data word. The received clock signal also feeds through a clock divider DIV4 246 to produce divided clock signal RCLK 248, which is used to latch data words into flip-flop 244. Flip-flop 244 outputs receive data (RX DATA) 250, which can then be written into a location within memory device 120.

Pipeline Delay and Propagation Delay

The clock and data signals illustrated in FIG. 2 are associated with two different types of delay components. (1) There are clock-rate-dependent "pipeline delay" components, which depend on the number of pipeline stages that these signals flow though. (2) There are also substantially clock-rate-independent "propagation delay" components (also referred to as "analog delays"), which for example can include channel delays, clock buffer delays, driver delays and receiver delays. In one embodiment, the data path in the upper portion of FIG. 2 includes a 3 UI (unit interval, e.g., a clock cycle of clock 204) clock-rate-dependent pipeline delay through serializer 212, a substantially clock-rate-independent propagation delay through write channel 230 (including driver and receiver delays), and an 8.5 UI clock-rate-dependent delay through DES 238. (Note that this 8.5 UI delay includes eight UI to wait for the eight serial bits to be received, and then 0.5 UI to wait for the center of the data eye.) The corresponding clock path includes substantially clock-rate-independent propagation delays through both FCLK channel 232 (including driver and receiver delays) and clock distribution network 242.

In this embodiment, the total analog propagation delay approximately equals (1) the delay through FCLK channel 232+(2) the clock distribution delay through clock distribution network 242–(3) the delay through write channel 230, and can be quantized as a number of "phase steps" (where N phase steps=1 UI, with N set, for example, to 64). Moreover, the corresponding total pipeline delay equals (1) 3 UI through serializer 212+(2) 8.5 UI through deserializer 238, which equals 11.5 UI. (Note that because the word alignment is separately calibrated and the word size is eight bits, the 11.5 UI pipeline delay is reduced modulo 8 to 3.5 UI.)

Hence, the full-rate calibration state for the clocked memory system is essentially the difference between the controller calibration state and the memory device calibration state, which equals the 3.5 UI pipeline delay—the total propagation delay.

Figure 3:
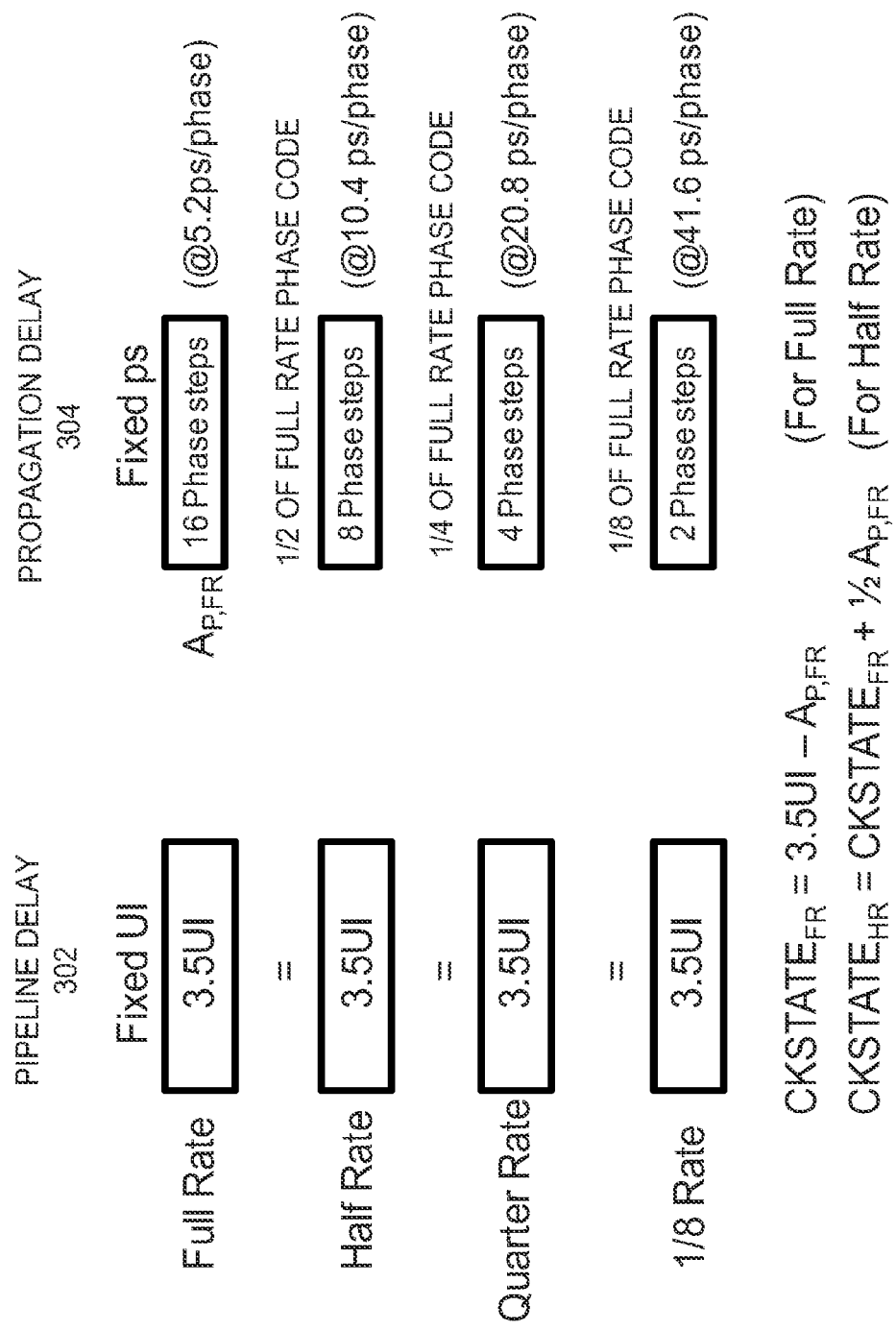
FIG. 3 illustrates pipeline and propagation delays in accordance with the disclosed embodiments.

When the clocked memory system switches from the full rate to a sub-rate, the 3.5 UI pipeline delay remains the same as the clock rate decreases. The propagation delay expressed in seconds remains essentially the same, however, which can be a problem if the delay components for calibration states are aggregated as a fixed number of clock periods. In the present embodiment, the number of increments accounting for the propagation delay is tracked separate from the pipeline delay and reduced proportionately with the clock period. For example, FIG. 3 illustrates the adjustments to the calibration state that are used to produce various sub-rate calibration states (for 1/2 rate, 1/4 rate and 1/8 rate) from a full-rate calibration state. As is illustrated in FIG. 3, the 3.5 UI pipeline delay 302 remains unchanged for each sub rate. (Note, however, that because the clock period increases for each sub-rate, the actual pipeline delay measured in picoseconds increases for each sub rate.)

In contrast to the pipeline delay 302, the propagation delay 304 (as expressed in number of UI) decreases as the clock period increases to keep the total propagation delay as measured in picoseconds constant. For example, assume that each UI is divided into 64 phase steps and that the total full-rate propagation delay 304 starts out at 16 phase steps. In this case, the number of phase steps drops to 8, 4 and 2 as the sub-rate drops to 1/2, 1/4 and 1/8, respectively. (Note that a corresponding "calibration state" can be encoded using 9 bits, which includes 3 bits to encode up to 8 UI of integer delay, and 6 bits to encode 64 phase step offsets.)

Also note that similar delay values and calibration states are computed for the read path. For example, in the read path, the total analog propagation delay approximately equals (1) the delay through FCLK channel+(2) the delay through read channel+(3) the delay through clock distribution network. Note that after a read path calibration state calculation, there is a chance that the read path will be bit locked, but not properly word aligned. In this case, to complete the calibration process, the system can perform an additional read path word alignment operation. Hence, in general, if the read path or write path analog delays are longer than one word, then word-alignment calibration is needed. Moreover, if word alignment has been performed to account for a larger than one-word delay, then the resulting calibration settings can be used to calculate new calibration settings for different frequencies. For example, if the analog delay was set to 16 UI+16 phase steps, then at half rate, the corresponding settings would be 8 UI+8 phase steps. Note that the word-alignment logic can remove a parallel word pipeline stage.

Figure 4:
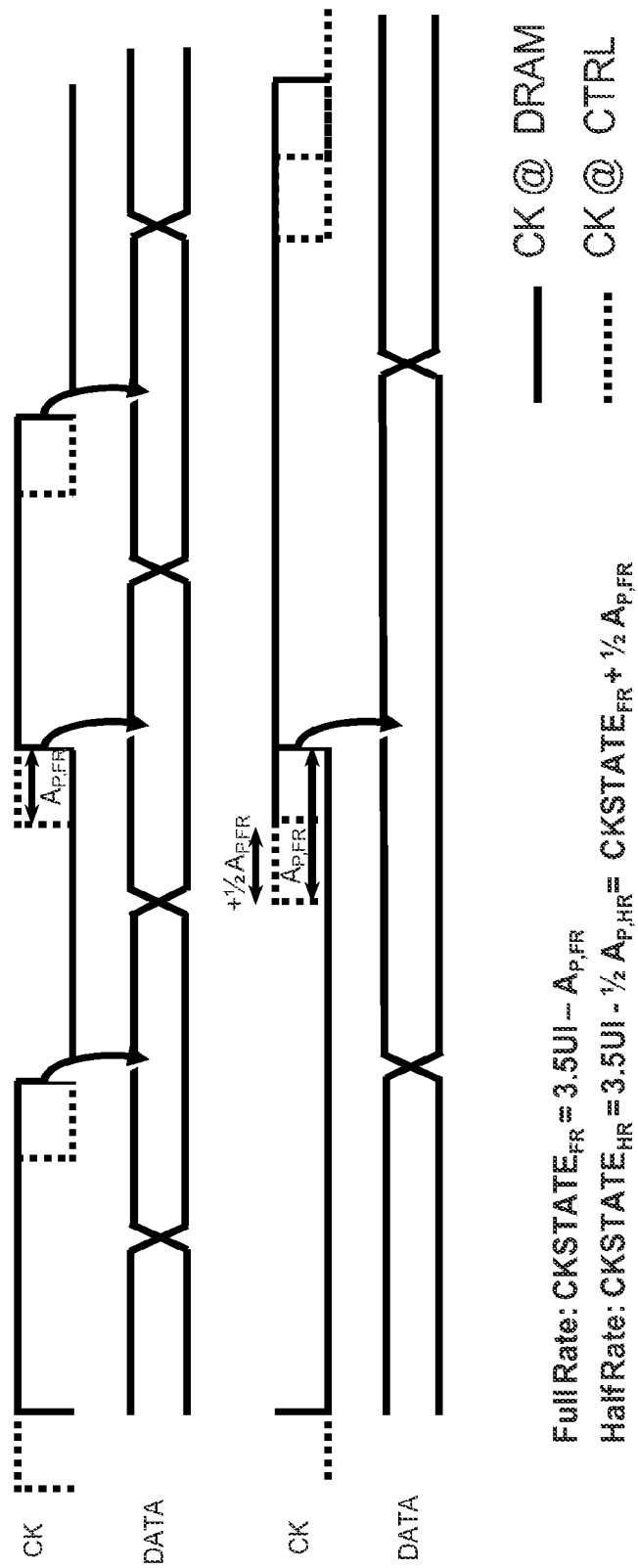
FIG. 4 presents a timing diagram illustrating half-rate and full-rate clocking accordance with the disclosed embodiments.

FIG. 4 presents a timing diagram that illustrates how the calibration state adjustment operates when the clocked memory system transitions from operating a full rate to half rate. (Note that the fixed analog propagation delay in increments of full-rate clock period phase steps is represented as $A_{P,FR}$.) In this diagram, the full rate calibration state $CKSTATE_{FR}=3.5$ UI$-A_{P,FR}$. Because each half-rate phase step is double the duration of a full-rate phase step, to keep the propagation delay constant, the $-A_{P,FR}$ term needs to be multiplied by 1/2. Hence, the half-rate calibration state $CKSTATE_{HR}=3.5$ UI$-1/2A_{P,FR}=CKSTATE_{FR}+1/2A_{p,FR}$. As can be seen from the timing diagram illustrated in FIG. 4, adding this $1/2A_{P,FR}$ term to $CKSTATE_{FR}$ effectively moves the clock edge to the center of the half-rate data eye.

Calibration Process

Figure 5:
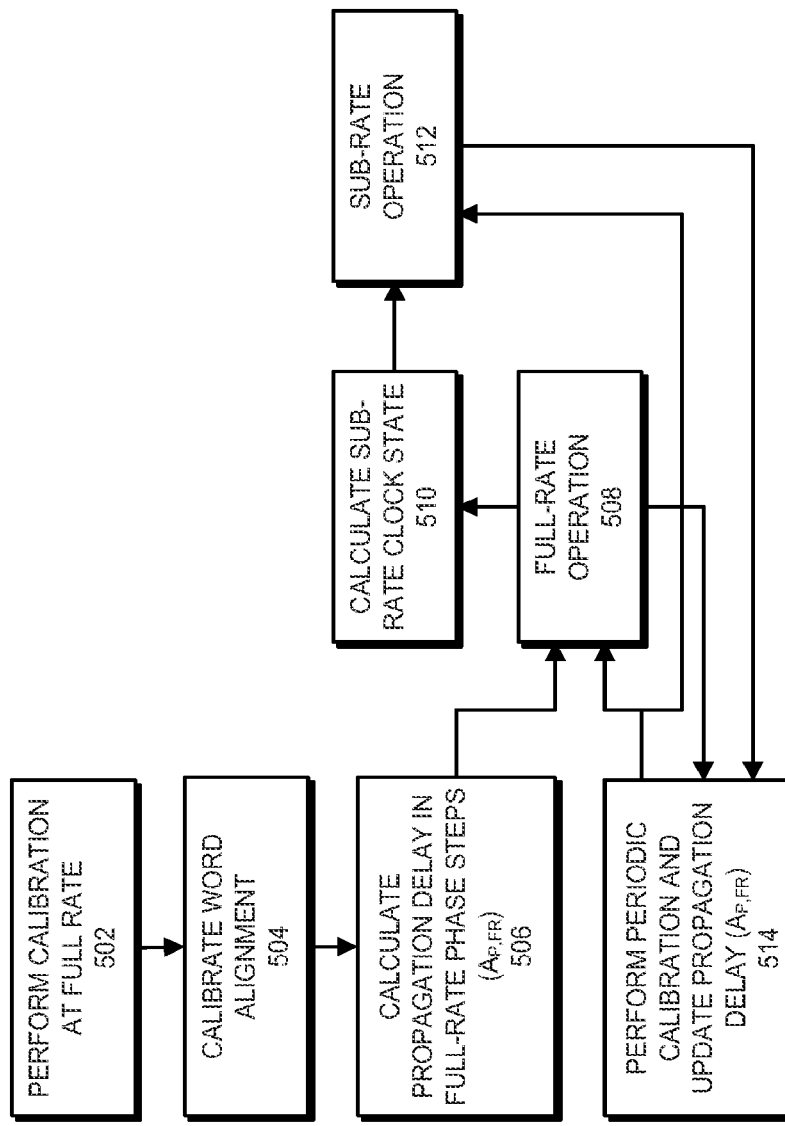
FIG. 5 presents a flow chart illustrating the calibration process in accordance with the disclosed embodiments.

FIG. 5 presents a flow chart illustrating a calibration process in accordance with one disclosed embodiment. At the start of the process, the clocked memory system performs a calibration at the full clock rate (step 502). The system also calibrates word alignment (step 504). As mentioned above, this word alignment calibration can potentially introduce a modulo eight calculation into the calibration state computation.

The system additionally computes the analog propagation delay $A_{P,FR}$ in full-rate phase steps at step 506. In one embodiment, a known pipeline delay is stored in a register, and is subtracted from an observed total delay to estimate analog delay. In another embodiment, calibration at two or more rates is performed back-to-back, and a delay versus rate intercept point is calculated to set the pipeline delay. Because the analog delay does not change, but pipeline delay is proportional to rate, two measurements at two known frequencies allow calculation of both pipeline and analog delay. Next, the system commences full-rate operation using this full-rate calibration state (step 508).

At a later time, when the system determines (for example, based on system load) that it is advantageous to commence a sub-rate operation, the system first calculates the sub-rate calibration state from the full-rate calibration state (step 510). As mentioned above, this can involve leaving the pipeline delay (expressed in clock period increments) the same, and adjusting the analog propagation delay (expressed in clock period phase steps) $A_{P,FR}$ based on the increase in clock period. For example, for 1/2-rate operation $A_{P,FR}$ is divided by 2, for 1/4-rate operation $A_{P,FR}$ is divided by 4, and for 1/8-rate operation $A_{P,FR}$ is divided by 8. Next, the system commences sub-rate operation using the computed sub-rate calibration state (512). In an alternative embodiment, during the initial calibration process, a full-rate calibration is performed. Also, sub-rate calibration states are calculated from full-rate calibration state, and the sub-rate calibration states are stored in registers. These sub-rate calibration states are then periodically updated by performing periodic calibration operations to compensate for drift.

The system also periodically performs a calibration operation. For example, after a specific time interval (e.g., one millisecond), the system can go from either full-rate operation 508 or sub-rate operation 512 to a calibration state to perform a periodic calibration operation and to update the analog propagation delay $A_{P,FR}$ (step 514). (Note that this periodic calibration is performed at the full clock rate.) The system then returns to either full rate operation 508 or half rate operation 510.

FIG. 5 can be modified in some embodiments. For instance, step 506 can calculate and store in registers all sub-rate clock states, which can then be indexed and used immediately upon rate changes. The step 514 periodic calibration can likewise recalculate and store all sub-rate clock states.

In a given embodiment, periodic calibration may be performed at the current clock rate rather than the full rate. For instance, recalibration of a half rate analog propagation delay $A_{P,HR}$ when operating at half rate can be used to set other propagation delays. For full-rate operation $A_{P,HR}$ is multiplied by 2, for 1/4-rate operation $A_{P,HR}$ is divided by 2, and for 1/8-rate operation $A_{P,HR}$ is divided by 4. The system may not allow recalibration at a lower rate to set a calibration state for a significantly higher rate—in other words, a recalibration performed at 1/4 or 1/8 rate may invalidate the full-rate calibration state, requiring that a half-rate or full rate calibration be performed before transitioning back to full rate.

Figure 6:
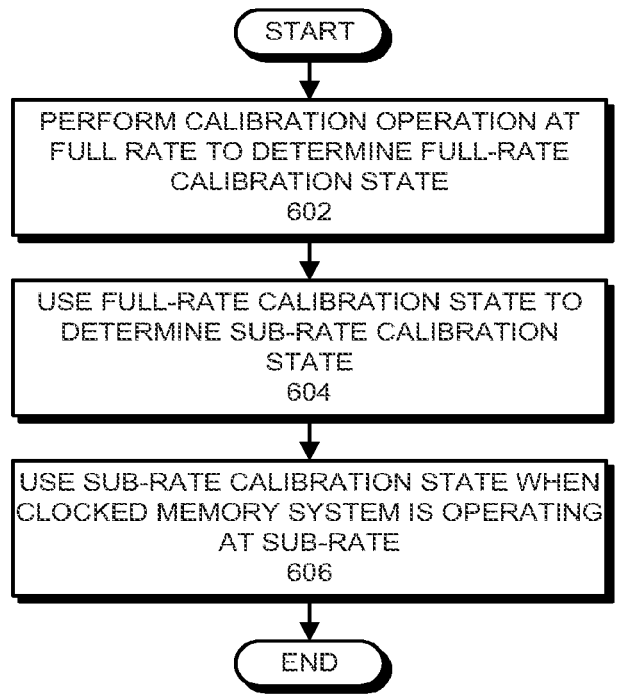
FIG. 6 presents a flow chart illustrating how the sub-rate calibration state is computed in accordance with the disclosed embodiments.

In summary, the system avoids having to perform calibration operations for the each sub-rate by performing a calibration operation at, e.g., the full rate, and then using the results of the full-rate calibration to compute calibration parameters for the sub-rates. More specifically, as shown in FIG. 6, the system first performs a calibration operation at the full rate to determine a full-rate calibration state (step 602). The system uses the full-rate calibration state to determine a sub-rate calibration state (604). Finally, the system uses the sub-rate calibration state while the clock memory system is operating at the sub-rate (606).

Figure 7:
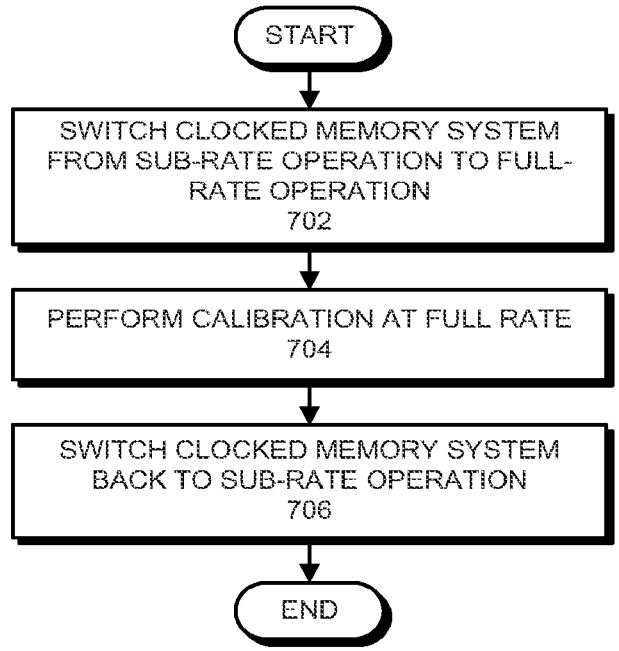
FIG. 7 presents a flow chart illustrating how calibration takes place a full rate in accordance with the disclosed embodiments.

Moreover, in one embodiment the system switches back to the full rate or a higher rate to perform periodic calibration operations. For example, as shown in FIG. 7, when the system is initially operating at a sub-rate, the system first switches the clocked memory system to operate at the full rate (step 702). Next, the system performs the calibration operation at the full rate (step 704) and then switches the clocked memory system back to operating at the sub rate (step 706). Note that switching to the sub rate involves first using the new full-rate calibration state to compute a new sub-rate calibration state.

Also note that instead of re-computing the pipeline delay for each sub-rate, the system can alternatively include a lookup table, which contains a baseline delay for each sub-rate, and this baseline delay can be added to a "drift tracking" delay element which is determined during the periodic full-rate calibration, or alternatively during a sub-rate calibration. More specifically, the system can perform initial calibration operations at a plurality of frequencies, including a full-rate frequency and associated sub-rate frequencies, to determine initial calibration states (baseline delays) for each of the frequencies. Next, the system can perform a subsequent calibration operation at a first frequency in the plurality of frequencies to determine a current calibration state for the first frequency, wherein the current calibration state includes a drift component that indicates how far the current calibration state for the first frequency has drifted from the initial calibration state for the first frequency. This drift component enables the system to quickly determine a current calibration state for a second frequency in the plurality of frequencies based on the drift component and the initial calibration state for the second frequency. Next, the system can use the current calibration state for the second frequency when the clocked memory system is operating at the second frequency.

Although binary sub-rates have been used to illustrate the embodiments, possible applications are not so limited. The memory controller need not be informed of the actual rates or expressly perform the calibration states. For instance, the current full-rate calibration state information can be placed in a host-processor-accessible register, with the host processor calculating and storing the appropriate sub-rate calibration state in another host-processor-accessible register at the time the host processor commands a rate change to the memory controller.

This disclosure recognizes that although analog delays are similar at different clock rates and will similarly track variations in temperature and voltage, small differences may exist that are not modeled in the base embodiment. For instance, slew rate limiting of drivers, channels, receivers, etc. may cause slightly different observed analog delay at higher rates. It is believed that these second order effects can be ignored in most embodiments, as the overall analog delay remains substantially the same at all rates, and the second-order effects may not even produce a different phase step at a slower rate. Thus "clock rate independent" as used herein recognizes that a parameter treated as clock rate independent may not be strictly independent of clock rate, but can be so modeled for purposes of an embodiment. A given embodiment can, however, attempt to model analog delay versus rate variation and factor such variation into the settings. For instance, full-rate and half-rate calibration operations can be performed back-to-back at system initialization, with the phase step obtained for the half-rate calibration compared to a half-rate phase step obtained by calculation from the calibrated full-rate phase step. If these two half-rate phase steps differ, a constant offset can be saved and used in runtime transitions between the rates.

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and apparatus described can be included in but are not limited to, application-specific integrated circuit (ASIC) chips, field-programmable gate arrays (FPGAs), and other programmable-logic devices.

What is claimed is:

1. A method for calibrating a clocked memory system, comprising:
    performing a calibration operation at a first frequency to determine a first calibration state for a delay between a clock signal and a corresponding data signal in the clocked memory system;
    using the first calibration state to determine a second calibration state, which is different than the first calibration state, for operation of the clocked memory system at a second frequency; and
    using the second calibration state when the clocked memory system is operating the second frequency.

2. The method of claim 1, wherein the method further comprises:
    performing a calibration operation at the second frequency to update the second calibration state;
    using the second calibration state to update the first calibration state; and
    using the updated first calibration state when the clocked memory system is operating at the first frequency.

3. The method of claim 1, wherein:
    the first calibration state includes a first pipeline delay component, which is clock-rate-dependent, and a first propagation delay component, which is clock-rate-independent; and
    the second calibration state includes a second pipeline delay component, which is clock-rate-dependent, and a second propagation delay component, which is clock-rate independent.

4. The method of claim 3, wherein the first and second propagation delay components account for one or more of the following:
    a driver delay;
    a channel delay;
    a receiver delay; and
    a clock buffer delay.

5. The method of claim 3, wherein:
    the delay components for calibration states are expressed in increments related to a clock period for the clocked memory system; and
    using the first calibration state to determine the second calibration state comprises
        setting the second pipeline delay component equal to the first pipeline delay component, and
        setting the second propagation delay component equal to the first propagation delay component divided by a ratio between the first frequency and the second frequency.

6. The method of claim 1, wherein:
    the first calibration state includes
        a first pipeline delay component, which is clock-rate-dependent, and
        a first offset component, which is clock-rate-independent;
    the second calibration state similarly includes a second pipeline delay component and a second offset component; and
    using the first calibration state to determine the second calibration state comprises
        setting the second pipeline delay component equal to the first pipeline delay component expressed in increments of time multiplied by the ratio between the first frequency and the second frequency, and
        setting the second offset component equal to the first offset component expressed in increments of time.

7. The method of claim 1, wherein:
    the first calibration state includes a first pipeline delay component;
    the second calibration state includes a second pipeline delay component;
    the first and second pipeline delay components are expressed in increments related to a clock period for the clocked memory system; and
    using the first calibration state to determine the second calibration state comprises setting the second pipeline delay component equal to the first pipeline delay component.

8. The method of claim 1, wherein:
    the first frequency is associated with a full rate for the clocked memory system; and
    the second frequency is associated with a binary sub-rate for the clocked memory system.

9. The method of claim 8, wherein using the first calibration state to determine the second calibration state involves ensuring that, when the clocked memory system is operating at the binary sub-rate, a receive sampler, which is controlled by the clock signal, is located in proximity to a center of a data eye for the data signal.

10. The method of claim 1, wherein the calibration operation is one of:
    an initial calibration operation; and
    a periodic calibration operation.

11. The method of claim 1, wherein the first and second calibration states each include separate calibration components for a read path and a write path of the clocked memory system.

12. The method of claim 1, wherein the first and second calibration states each specify a word alignment between the clock signal and the data signal.

13. The method of claim 1, wherein if the clocked memory system is operating at the second frequency prior to the calibration operation, the method further comprises:
switching the clocked memory system to operate at the first frequency prior to the calibration operation; and
switching the clocked memory system back to operating at the second frequency after the calibration operation.

14. A memory controller for a clocked memory system, comprising:
a calibration mechanism configured to perform a calibration operation at a first frequency to determine a first calibration state for a delay between a clock signal and a corresponding data signal in the clocked memory system;
wherein the calibration mechanism is configured to use the first calibration state to determine a second calibration state, which is different than the first calibration state, for operation of the clocked memory system at a second frequency; and
wherein the memory controller is configured to use the second calibration state when the clocked memory system is operating at the second frequency.

15. The memory controller of claim 14, wherein:
the calibration mechanism is configured to
perform a calibration operation at the second frequency to update the second calibration state, and
use the second calibration state to update the first calibration state; and
the clocked memory system is configured to use the updated first calibration state when the clocked memory system is operating at the first frequency.

16. The memory controller of claim 14, wherein:
the first calibration state includes a first pipeline delay component, which is clock-rate-dependent, and a first propagation delay component, which is clock-rate-independent; and
the second calibration state includes a second pipeline delay component, which is clock-rate-dependent, and a second propagation delay component, which is clock-rate independent.

17. The memory controller of claim 16, wherein:
the delay components for calibration states are expressed in increments related to a clock period for the clocked memory system; and
while using the first calibration state to determine the second calibration state, the calibration mechanism is configured to
set the second pipeline delay component equal to the first pipeline delay component, and
set the second propagation delay component equal to the first propagation delay component divided by a ratio between the first frequency and the second frequency.

18. The memory controller of claim 14,
the first calibration state includes
a first pipeline delay component, which is clock-rate-dependent, and
a first offset component, which is clock-rate-independent;
the second calibration state similarly includes a second pipeline delay component and a second offset component; and
using the first calibration state to determine the second calibration state comprises
setting the second pipeline delay component equal to the first pipeline delay component expressed in increments of time multiplied by the ratio between the first frequency and the second frequency, and
setting the second offset component equal to the first offset component expressed in increments of time.

19. The memory controller of claim 14, wherein:
the first calibration state includes a first pipeline delay component;
the second calibration state includes a second pipeline delay component;
the first and second pipeline delay components are expressed in increments related to a clock period for the clocked memory system; and
using the first calibration state to determine the second calibration state comprises setting the second pipeline delay component equal to the first pipeline delay component.

20. The memory controller of claim 14, wherein:
the first frequency is associated with a full rate for the clocked memory system; and
the second frequency is associated with a binary sub-rate for the clocked memory system.

* * * * *